United States Patent [19]
Womack

[11] Patent Number: 5,872,739
[45] Date of Patent: Feb. 16, 1999

[54] SENSE AMPLIFIER FOR LOW READ-VOLTAGE MEMORY CELLS

[75] Inventor: Richard Womack, Albuquerque, N. Mex.

[73] Assignee: Radiant Technologies, Albuquerque, N. Mex.

[21] Appl. No.: 841,905

[22] Filed: Apr. 17, 1997

[51] Int. Cl.⁶ .................................................. G11C 7/02
[52] U.S. Cl. ................... 365/207; 365/205; 365/189.07; 365/210
[58] Field of Search .................................... 365/207, 205, 365/189.07, 145, 210

[56] References Cited

U.S. PATENT DOCUMENTS

| | | | |
|---|---|---|---|
| 5,317,218 | 5/1994 | Liu | 365/207 |
| 5,410,504 | 4/1995 | Ward | 365/149 |
| 5,469,382 | 11/1995 | Yero | 365/207 |
| 5,487,045 | 1/1996 | Trodden | 365/207 |
| 5,539,694 | 7/1996 | Rouy | 365/210 |

*Primary Examiner*—Huan Hoang
*Attorney, Agent, or Firm*—Calvin B. Ward

[57] ABSTRACT

A sense amplifier for comparing the resistance of a reference cell connected to a reference bit line to the resistance of a data cell connected to a data bit line. The amplifier includes a first terminal for connecting the sense amplifier to the reference bit line and a second terminal for connecting the sense amplifier to the data bit line. A reference current to voltage amplifier is connected to the first terminal for generating a reference voltage related to the current flowing through the reference bit line and for maintaining the first terminal at a reference potential when the current flowing through the reference bit line is less than a first current value. A data current to voltage amplifier is connected to the second terminal for generating a data voltage related to the current flowing through the data bit line and for maintaining the second terminal at the reference potential when the current flowing through the data bit line is less than a second current value. A comparitor compares the reference and data voltages. The data current to voltage amplifier includes an operational amplifier for measuring the difference between a potential on a first conductor and the potential on the data bit line. The operational amplifier allows the reference potential to be set at a lower voltage than is available in prior art designs. The invention utilizes a capacitive dividing scheme for pre-charging the bit lines prior to connecting the sense amplifier.

3 Claims, 1 Drawing Sheet

SENSE AMPLIFIER FOR LOW READ-VOLTAGE MEMORY CELLS

FIELD OF THE INVENTION

The present invention relates to memory systems, and more particularly, to an improved sense amplifier for reading memory cells that cannot tolerate large voltages during reading.

BACKGROUND OF THE INVENTION

To simplify the following discussion, the present invention will be discussed in terms of a memory based on non-destructively read ferroelectric memory cells. These cells may be viewed as a field effect transistor (FET) in which the gate oxide has been replaced by a ferroelectric layer. The ferroelectric layer may be polarized in one of two directions. The polarization exerts an electric field on a semiconductor layer whose resistance is altered in response to the direction of polarization. Conversely, the direction of polarization, and hence, the value of the stored data bit, can be determined by measuring the resistance of the semiconductor layer. The resistance is normally measured by observing the current that flows between two electrodes that are spaced apart from one another and in contact with the semiconductor layer. These electrodes are analogous to the source and drain terminals on a conventional FET.

The direction of polarization of the ferroelectric layer is set by manipulating the voltages on the source and drain electrode together with a third "gate" electrode which is disposed on the opposite side to the ferroelectric layer from the semiconducting layer. Hence, care must be taken during read operations to assure that the voltage applied to the electrodes is not sufficient to disturb the contents of the memory cell. If the read voltage is substantially less than the coercive voltage of the ferroelectric layer, the contents of the memory cell will not be lost during the read operation.

Unfortunately, limitations on the read voltage lead to reduced reading speed when conventional sense amplifiers are utilized. The time needed to sense the current is determined by the rise time of the bit lines and the sense voltage. The sense amplifier requires a voltage excursion of some minimum value to distinguish a "1" from a "0". The time required for this voltage swing can be reduced if the voltages applied to the circuit are increased.

In addition, conventional sense amplifiers of the type used to read EEPROM memory cells have difficulty providing the low voltage levels needed to read ferroelectric FETs. The read voltages supplied by these amplifiers are determined by the threshold voltage of a gate within the amplifier. Unfortunately, the typical threshold voltages are too high to provide a regulated source of read voltage at the level required to prevent the contents of the memory cell from being disturbed.

Broadly, it is the object of the present invention to provide an improved sense amplifier.

It is a further object of the present invention to provide a sense amplifier with a reduced settling time.

It is a still further object of the present invention to provide a sense amplifier that can generate lower read voltages than prior art sense amplifiers.

These and other objects of the present invention will become apparent to those skilled in the art from the following detailed description of the invention and the accompanying drawings.

SUMMARY OF THE INVENTION

The present invention is a sense amplifier for comparing the resistance of a reference cell connected to a reference bit line to the resistance of a data cell connected to a data bit line. The amplifier includes a first terminal for connecting the sense amplifier to the reference bit line and a second terminal for connecting the sense amplifier to the data bit line. A reference current to voltage amplifier is connected to the first terminal for generating a reference voltage related to the current flowing through the reference bit line and for maintaining the first terminal at a reference potential when the current flowing through the reference bit line is less than a first current value. A data current to voltage amplifier is connected to the second terminal for generating a data voltage related to the current flowing through the data bit line and for maintaining the second terminal at the reference potential when the current flowing through the data bit line is less than a second current value. A comparitor compares the reference and data voltages. The data current to voltage amplifier includes an operational amplifier for measuring the difference between a potential on a first conductor and the potential on the data bit line. The operational amplifier allows the reference potential to be set at a lower voltage than is available in prior art designs. The invention utilizes a capacitive dividing scheme for pre-charging the bit lines prior to connecting the sense amplifier.

DETAILED DESCRIPTION OF THE INVENTION

Figure 1:
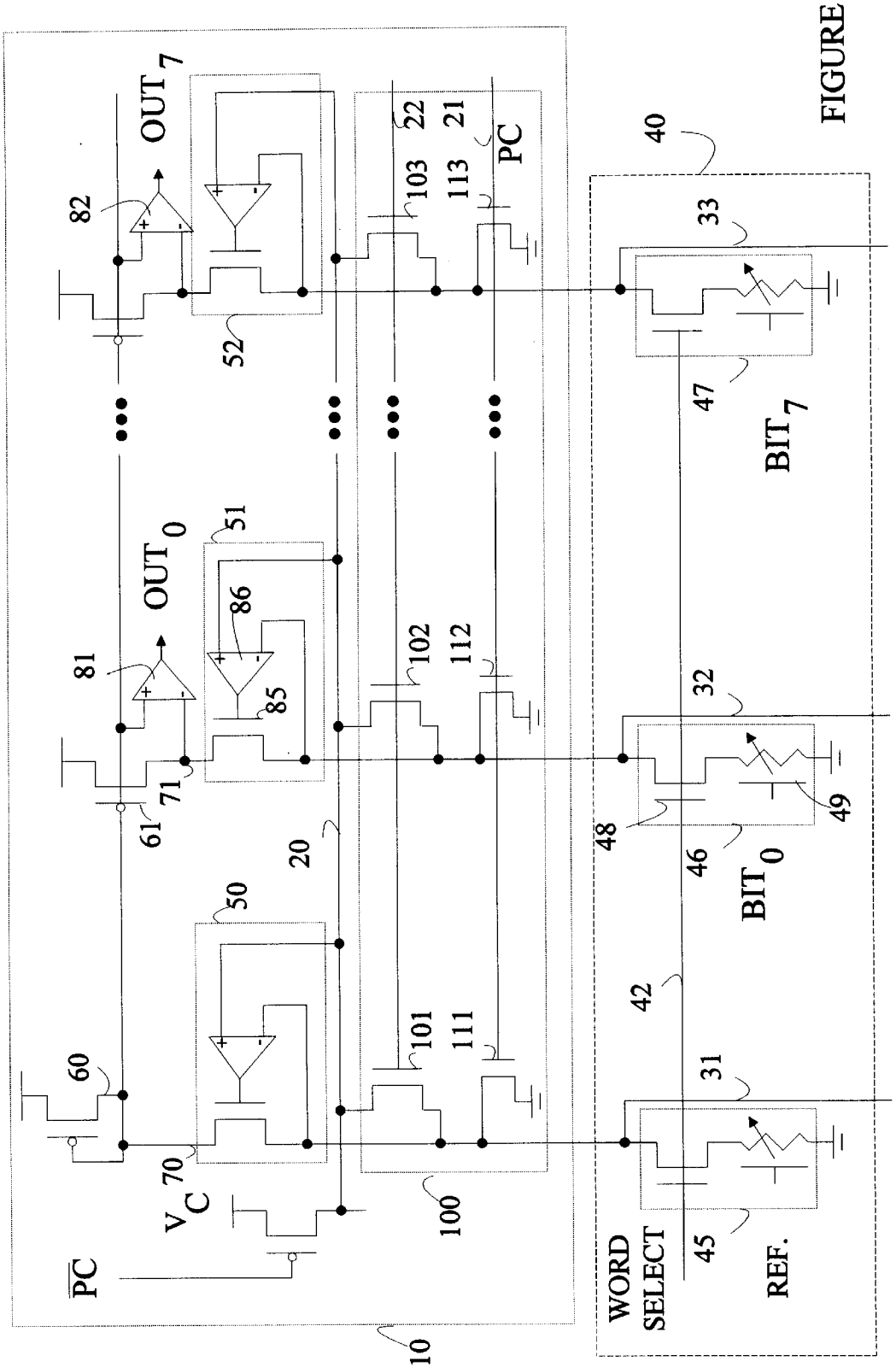
FIG. 1 is a schematic drawing of a memory system utilizing a sense amplifier according to the present invention.

The present invention may be more easily understood with reference to a sense amplifier block according to the present invention connected to a memory constructed from ferroelectric FETs. Refer to FIG. 1 which is a schematic drawing of such a memory system. The memory includes a plurality of words and a sense amplifier block 10 for reading the data stored in the words. In the example shown in FIG. 1, the ferroelectric memory cells are organized into words which include 9 ferroelectric memory cells. A typical word is shown at 40. Eight of the memory cells are used to store data bits; the ninth cell is a reference cell. Data storage cells for bits 0 and 7 are shown at 46 and 47, respectively. The corresponding reference cell is shown at 45. Each storage cell includes an isolation transistor and a ferroelectric FET. A typical isolation transitor is shown at 48. A typical ferroelectric FET is shown at 49.

As noted above, data is stored by altering the polarization direction of the ferroelectric layer in each ferroelectric FET. The polarization determines the resistance measured between the source and drain electrodes on the semiconducting layer of the ferroelectric FET. For any given ferroelectric FET, there will be a difference in resistance depending on direction of polarization; however, the absolute values of the resistances corresponding to the high and low resistance states is known to vary from cell to cell.

The reference cell provides a calibration that corrects for variation in the ferroelectric FETs that arise from the fabrication process or the storage history of the word. The ferroelectric FETs are constructed by depositing various layers on a conventional CMOS circuit that includes the other circuit components such as the gate transistors. Differences in the uniformity of the various layers across the substrate give rise to differences in the resistances characterizing the states of the ferroelectric FETs. Since the reference cell is constructed adjacent to the data cells, the reference cell will reflect the variations experienced by the other nearby storage cells during the fabrication process.

Memory cells based on ferroelectric FETs also suffer from aging problems. Data is represented by two resistance states, a high resistance state and a low resistance state. Once the data is stored, the resistance states slowly shift. If the data corresponds to the high resistance state, the resistance of this state tends to decrease over time until it is no longer distinguishable from the low resistance state. Similarly, if the device is set to the low resistance state, the resistance tends to increase with time. The shift in state is corrected each time a memory cell is re-written. Hence, a reference cell that has the same read-write history as the bit storage cells also provides a means for correcting for these aging effects.

In the preferred embodiment of a memory system utilizing the present invention, each bit of a word, including the reference bit, is connected by the appropriate isolation transistor to a bit line. The bit lines corresponding to the reference bits, bit 0, and bit 7 are shown at 31–33, respectively. The word that is connected at any given time is determined by a signal placed on the appropriate word select line. The word select line for memory word 40 is shown at 42.

Sense amplifier block 10 compares the current drawn through each of the bit lines connected to data bits with that drawn through bit lines connected to the reference cell while the bit lines are held at substantially constant voltage. The manner in which the current comparison takes place will be explained with reference to the sensing of the data stored in memory cell 46 connected to bit line 32. For the purposes of this discussion, it will be assumed that the sense amplifier has been turned on and is ready to read the currents. The manner in which the circuit is pre-charged to reach this state will be discussed in detail below.

Sense amplifier block 10 may be viewed as comprising a plurality of current to voltage amplifiers which convert the current flowing through each bit line to a voltage. Exemplary current to voltage amplifiers are shown at 50–52. The gain curves for the current to voltage amplifiers connected to the data bits are offset with respect to the gain curve of the current to voltage connected to the reference cell. The amount of the offset is determined by the current mirrors comprising transistor 60 and the corresponding transistors connected to each of the data bit lines.

Consider the case in which reference cell 45 is set to a low resistance state. Then sense amplifier block 10 must determine if bit cell 46 is in a high or low resistance state. In this case, the current available to bit line 32 is set to be a fraction of that available to reference bit line 31. In the preferred embodiment of the present invention, the ratio of the two currents is set to be 3/4. Consider the case in which data cell 46 is also in the low resistance state. If the resistance values of each of the cells were exactly equal, bit line 32 would attempt to draw the same current as bit line 31. However, bit line 32 is restricted to $3/4^{th}$ of the current of bit line 31; hence the voltage at node 71 will fall relative to the voltage at node 70. Conversely, if data cell 46 is in the high resistance state, it will draw less current than bit line 31, and hence, force the voltage at Node 71 to be higher than that of Node 70. The voltage comparison is carried out by a comparitor associated with each of the bit lines. Exemplary comparitors are shown at 81 and 82 corresponding respectively to bit lines 32 and 33.

If the reference cell is chosen to be the high resistance state, transistors 60 and 61 are chosen such that the ratio of the currents is reversed, i.e., reference bit line 31 is supplied with $3/4^{th}$ the current of bit line 32. The ratio of the currents is specified by the area of the transistors.

To assure that the currents compared by each comparitor are proportional to the resistance values in the data cells, the bit lines must be clamped at the same voltage during the measurements. The voltage clamping function is also provided by the current to voltage amplifiers shown in FIG. 1. Referring to current to voltage amplifier 51, operational amplifier 86 and transistor 85 maintain bit line 32 at the pre-charge potential described below as long as transistor 61 can supply sufficient current.

Prior art circuits similar to current to voltage amplifier 51 utilize a comparitor in place of operational amplifier 86. The comparitor design, however, does not operate satisfactorily when the bit line must be clamped at a voltage which is less than the comparitor threshold voltage. The operational amplifier design of the present invention allows the bit lines to be clamped at voltages that are significantly less than a gate threshold value.

Sense amplifier block 10 can read the resistances on the bit lines and determine the data bits in a time of the order of 15 nsec. once the voltage on the bit lines has stabilized. For a typical ferroelectric FET, the voltage on the bit lines must be kept below about 0.4 V to assure that the data stored in the data cells is not lost as a result of the read operation. Since 0.4V is below the threshold of CMOS transistors, the time needed for the bit lines to reach this voltage and settle can dominate the read time. Hence, the preferred embodiment of the present invention utilizes a pre-charge circuit 100 which rapidly brings the bit lines to 0.4 V in preparation for reading the data.

Pre-charge circuit operates by pre-charging line 20 to Vc and the bit lines to ground. Each bit line is connected to line 20 by a corresponding switching transistor and to ground by a second switching transistor. Exemplary switching transistors for connecting the bit lines to line 20 are shown at 101–103. The corresponding switching transistors for connecting the bit lines to ground are shown at 111–113, respectively. The pre-charge operation is initiated by generating a precharge signal PC on line 21 and turning transistors 101–103 off via the application of a logic signal to line 22. After the line 20 is pre-charged, line 20 is coupled to the bit lines via the switching transistor connected between line 20 and each of the bit lines, and transistors 111–113 are turned off to isolate the bit lines from ground. The ratio of the capacitances of line 20 and the bit lines is chosen such that the final voltage is 0.4 V. After the bit lines have settled at this voltage, the switching transistors connecting the bit lines to line 20 are turned off, and the data read. Hence, the bit lines and line 20 are set at 0.4 V at the beginning of the read operation.

The precharge scheme of the present invention has been described in terms of initially connecting the pre-charge line to Vc and the bit lines to ground. However, it will be appreciated that other potentials could be utilized without departing from the teachings of the present invention, provided the pre-charge potential applied to the bit lines does not exceed the value that will disturb the data in the data cells. In general, if the pre-charge conductor has a capacitance C1 and is charged to Vc and the bit lines have a total capacitance of C2 and are charged to Vb, then the bit lines will come to a reference potential that is equal to $V_b+(V_c-V_b)*(C_1/(C_1+C_2))$.

Various modifications to the present invention will become apparent to those skilled in the art from the foregoing description and accompanying drawings. Accordingly, the present invention is to be limited solely by the scope of the following claims.

What is claimed is:

1. A sense amplifier for comparing the resistance of a reference cell connected to a reference bit line to the resistance of a data cell connected to a data bit line, said amplifier comprising:

a first terminal for connecting said sense amplifier to said reference bit line;

a second terminal for connecting said sense amplifier to said data bit line;

a reference current to voltage amplifier for generating a reference voltage related to the current flowing through said reference bit line and for maintaining said first terminal at a reference potential during the comparison of said resistance of said reference cell with the resistance of said data cell;

a data current to voltage amplifier for generating a data voltage related to the current flowing through said data bit line and for maintaining said second terminal at said reference potential during the comparison of said resistance of said reference cell with said resistance of said data cell; and a comparitor for comparing said reference and data voltages, wherein said data current to voltage amplifier comprises an operational amplifier for measuring the difference between a potential on a conductor and the potential on said data bit line.

2. A sense amplifier for comparing the resistance of a reference cell connected to a reference bit line to the resistance of a data cell connected to a data bit line, said amplifier comprising:

a first terminal for connecting said sense amplifier to said reference bit line;

a second terminal for connecting said sense amplifier to said data bit line;

a reference current to voltage amplifier for generating a reference voltage related to the current flowing through said reference bit line and for maintaining said first terminal at a reference potential during the comparison of said resistance of said reference cell with the resistance of said data;

a data current to voltage amplifier for generating a data voltage related to the current flowing through said data bit line and for maintaining said second terminal at said reference potential during the comparison of said resistance of said reference cell with said resistance of said data;

a comparitor for comparing said reference and data voltages, wherein said data current to voltage amplifier comprises an operational amplifier for measuring the difference between a potential on a conductor and the potential on said data bit line; and a precharge circuit for connecting each of said bit lines to ground and said conductor to a precharge voltage, Vc, in response to a first control signal and for connecting said conductor to said bit lines in response to a second control signal, wherein said reference potential is equal to Vc*(C1/(C1+C2)) wherein C1 is the capacitance of said conductor and C2 is the sum of the capacitances of all bit lines connected to said sense amplifier.

3. In a memory having a plurality of bit lines connected to a sense amplifier, a method for precharging said bit lines to a reference potential, said method comprising the steps of connecting a conductor having a capacitance C1 to a terminal having a voltage Vc and connecting said bit lines to a terminal at a potential Vb and then connecting said bit lines to said conductor wherein Vc, Vb, and C1 are chosen such that said reference potential is equal to Vb+(Vc−Vb)*(C1/(C1+C2)) wherein C1 is the capacitance of said conductor and C2 is the sum of the capacitances of said bit lines.

* * * * *